United States Patent
Gong et al.

(10) Patent No.: US 11,073,550 B1
(45) Date of Patent: Jul. 27, 2021

(54) TEST VEHICLE FOR PACKAGE TESTING

(71) Applicant: Xilinx, Inc., San Jose, CA (US)

(72) Inventors: Yuqing Gong, San Jose, CA (US); Suresh Parameswaran, Fremont, CA (US); Boon Y. Ang, Sunnyvale, CA (US)

(73) Assignee: XILINX, INC., San Jose, CA (US)

(*) Notice: Subject to any disclaimer, the term of this patent is extended or adjusted under 35 U.S.C. 154(b) by 210 days.

(21) Appl. No.: 16/398,012

(22) Filed: Apr. 29, 2019

(51) Int. Cl.
  *G01R 31/28* (2006.01)
  *G01R 31/50* (2020.01)
  *G01R 31/71* (2020.01)

(52) U.S. Cl.
  CPC ..... *G01R 31/2853* (2013.01); *G01R 31/2884* (2013.01); *G01R 31/2896* (2013.01); *G01R 31/50* (2020.01); *G01R 31/71* (2020.01)

(58) Field of Classification Search
  CPC ........... G01R 1/0491; G01R 31/265; G01R 31/3012; G01R 31/318511
  See application file for complete search history.

(56) References Cited

U.S. PATENT DOCUMENTS

| | | | |
|---|---|---|---|
| 6,564,986 B1 | 5/2003 | Hsieh | |
| 7,193,315 B2 | 3/2007 | Jang et al. | |
| 2007/0152692 A1* | 7/2007 | Kinsley | G01R 31/71 324/750.3 |
| 2013/0069063 A1* | 3/2013 | Xusheng | H01L 25/105 257/48 |
| 2013/0248859 A1* | 9/2013 | Frye | H01L 21/561 257/48 |
| 2015/0253374 A1 | 9/2015 | Lee et al. | |

* cited by examiner

*Primary Examiner* — Tung X Nguyen
(74) *Attorney, Agent, or Firm* — Patterson + Sheridan, LLP (57) ABSTRACT

A test vehicle, along with methods for fabricating and using a test vehicle, are disclosed herein. In one example, a test vehicle is provided that includes a substrate, at least a first passive die mounted on the substrate, and at least a first test die mounted on the substrate. The first test die includes test circuitry configured to test continuity through solder interconnects formed between the substrate and the first passive die.

19 Claims, 7 Drawing Sheets

TEST VEHICLE FOR PACKAGE TESTING

TECHNICAL FIELD

Embodiments of the present disclosure generally relate to test vehicles for simulating testing of chip packages, methods for fabricating and using the same.

BACKGROUND ART

Electronic devices, such as tablets, computers, server, in-door telecom, out-door telecom, industrial computers, high performance computing data centers, copiers, digital cameras, smart phones, control systems and automated teller machines, among others, often employ electronic components which leverage chip packages for increased functionality and higher component density. Conventional chip packages include one or more stacked components such as integrated circuit (IC) dies, through-silicon-via (TSV) interposer, and a package substrate, with the chip package itself stacked on a printed circuit board (PCB). The IC dies may include memory, logic, MEMS, RF or other IC device.

However, design qualification and manufacturing of new dies and chip packages are costly and time consuming endeavors. The time needed for design of the circuit layout within the die, development of mask sets, and die tape out, often delays the final configuration of the dies such that reliability testing of the electrical and mechanical connections between the dies and substrates of the chip package are undesirably delayed, further delaying release of the production chip package to consumers.

In order to mitigate such delays in reliability testing, fabricators often utilize a test vehicle for reliability testing prior to completion of the die design. The test vehicle is generally a full scale mock-up of the production chip package, complete with dies electrically and mechanically connected to the substrates in the same manner as the production chip package, except in that the dies utilized on the test vehicle only have logic circuitry configured to functionally test the interconnections between the die and substrate, without the identical functional circuitry which would be present in the production die.

Figure 1:
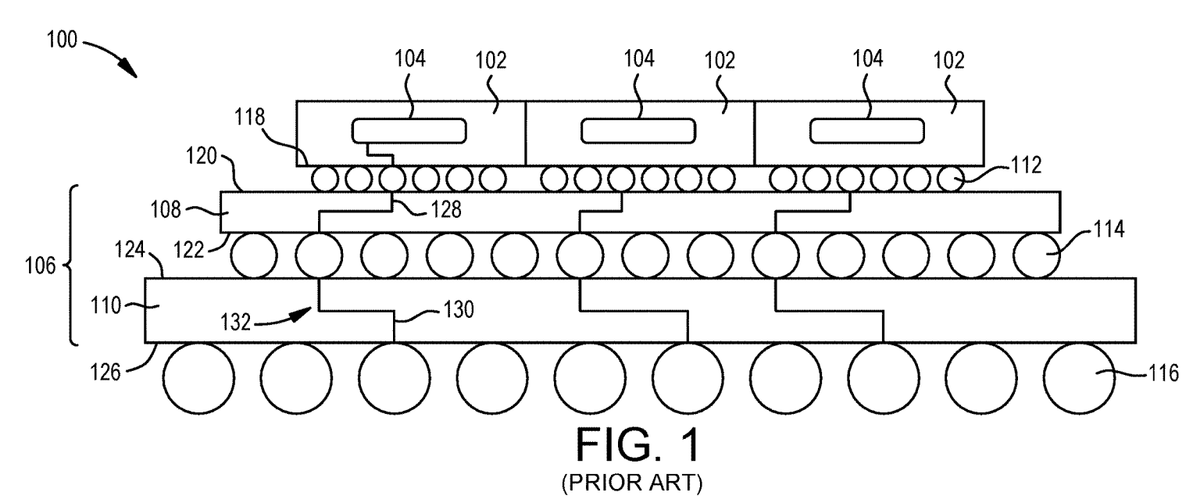
FIG. 1 is a schematic front view of a conventional test vehicle.

FIG. 1 is a schematic front view of one example of a conventional test vehicle 100. The conventional test vehicle 100 includes one or more test dies 102 mounted on a substrate 106. Generally, the number, size and layout of the test dies 102 on the substrate 106 are selected to be identical to that of the production chip package for which the test vehicle 100 is to be utilized for reliability testing. The substrate 106 may be configured as a single substrate, such as a package substrate, or comprise a plurality of stacked substrates. In the example depicted in FIG. 1, the substrate 106 is configured as an interposer substrate 108 mounted on a package substrate 110.

Solder interconnects 112 are utilized to mount a bottom surface 118 of the test dies 102 to a top surface 120 of the interposer substrate 108. Solder connections 114 are utilized to mount a bottom surface 122 of the interposer substrate 108 to a top surface 124 of the package substrate 110. Solder balls 116 are utilized to mount a bottom surface 126 of the package substrate 110 to a printed circuit board (PCB) or test device not shown.

The solder interconnects 112 electrically and mechanically couple test circuitry 104 of the test dies 102 to substrate circuitry 132 of the substrate 106. The substrate circuitry 132 of the substrate 106, as shown in FIG. 1, includes interposer circuitry 128 formed in the interposer substrate 108 and package circuitry 130 formed in the package substrate 110. The solder connections 114 electrically and mechanically couple test circuitry 104 of the test dies 102 to interposer circuitry 128 of the interposer substrate 108, while the solder balls 116 electrically and mechanically couple the interposer circuitry 128 of the interposer substrate 108 to the package circuitry 130 of the package substrate 110.

The test circuitry 104 of each test die 102 is configured only to test the solder interconnects 112 disposed between the test die 102 containing its own test circuitry 104 and the interposer circuitry 128 of the interposer substrate 108. Thus, each test die 102 is configured to test only its own solder interconnects 112 that are in electrical contact directly with the test circuitry 104 within the same test die 102.

As conventionally known, the test die 102 includes many transistors and metal interconnects. Accordingly, the test die 102 is costly and time consuming to design and manufacture. Thus, conventional test dies 102 are typically fabricated utilizing older (i.e., larger) technology nodes, for example 28 nm, 65 nm and the like, to save cost and design time. However, utilization of such older technology nodes limits the kinds of testing that may be performed by the test die 102. For example, test circuitry 104 fabricated utilizing 28 nm cannot duplicate the performance and reliability characteristics of circuitry fabricated using latest (i.e., smaller) technology nodes. For example, cross-talk and capacitive coupling between conductors comprising the circuitry is much different at latest nodes compared to 28 nm designs. Thus, conventional test vehicles 100, while suitable for mechanical and electrical reliability of the solder connections, cannot provide reliability or performance information related to transmission over circuitry fabricated at smaller nodes. Additionally, since every test die 102 is designed for a specific production chip package, the need for new test vehicles to be designed from scratch for every new design of a production chip package is undesirable due to the cost, time and complexity of design and manufacture.

Thus, there is a need for an improved test vehicle, along with methods for fabricating and using a test vehicle.

SUMMARY

A test vehicle, along with methods for fabricating and using a test vehicle, are disclosed herein. In one example, a test vehicle is provided that includes a substrate, at least a first passive die mounted on the substrate, and at least a first test die mounted on the substrate. The first test die includes test circuitry configured to test continuity through solder interconnects formed between the substrate and the first passive die.

In another example, a test vehicle is provided that includes a substrate, one or more passive dies including at least a first passive die, and one or more test dies including at least a first test die. The first passive die and the first test die are mounted on the substrate by solder interconnects. The first passive die contains passive circuitry and does not contain functional circuitry. The first test die includes test circuitry configured to test a characteristic of the first passive die and a characteristic of the first test die.

In still another example, a method for testing a test vehicle is provided that includes inserting a test vehicle containing one or more test dies and one or more passive dies into a test socket of a test system enabling communication between the test vehicle and the test system through solder balls disposed on a bottom surface of the test vehicle; providing one or more test signals to the one or more test dies from the test system through the solder balls; transmitting the one or more test signals from the one or more test dies through interconnect circuitry of the substrate to the one or more passive dies; and obtaining information regarding a characteristic under test of the one or more passive dies in response to the test signal provided to the test circuitry of the one or more test dies, the one or more passive dies containing passive circuitry and not containing functional circuitry.

In another example, a method for fabricating a test vehicle is provided. The method includes mounting one or more test dies on a substrate. The test die includes active, i.e., functional, circuitry configured to test at least the solder interconnects between the test die and at least one other die mounted to the substrate. The method further includes mounting one or more passive dies to the substrate. The passive die includes passive circuitry, for example circuitry without transistors.

In yet another example, a method for designing a chip package using a test vehicle is provided. The method includes determining a geometry of a chip package prior to finalizing the functional die or dies of chip package, determining a geometry of a test vehicle based upon the geometry and solder interconnect pattern of the chip package under design, testing the test vehicle placed while the chip package under design is still in the design stage, determining in response to the obtained information if a design change to the chip package under design is needed.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Test vehicles, along with methods for fabricating and using a test vehicle, are disclosed herein. The test vehicles described herein generally include two or more dies mounted on at least one substrate in a geometric configuration that mimics a production chip package. Since the test vehicle has the same physical geometry and solder connection layout as a production chip package for which the test vehicle was designed, the test vehicle can effectively be utilized for reliability testing and qualification of the production chip package in parallel with the design and fabrication process of the production chip package. Advantageously, the parallel testing and design shortens the development cycle, allowing production chip packages to be released for production and sale much faster than conventional processes. Moreover, since the test vehicle described below leverages passive dies for testing large numbers of the solder connections within the test vehicle, the cost and design and fabrication time of the test vehicle is significantly reduced as compared to conventional test vehicles such as described with reference to FIG. 1. Additionally, the low cost and fast design cycle of the test vehicles described herein enables latest technology nodes (e.g., less than 28 nm) to be utilized. Beneficially, the use of latest technology nodes enables circuit cross-talk, capacitive coupling and performance testing which cannot be effectively performed utilizing the older and larger technology nodes found in conventional test vehicles.

Figure 2:
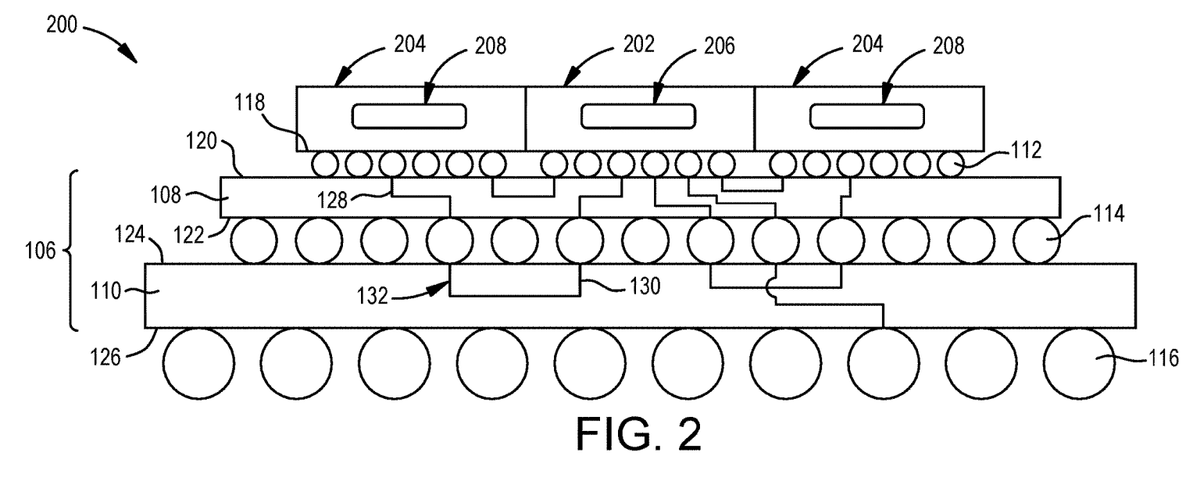
FIG. 2 is a schematic front view of an exemplary test vehicle having test and passive dies mounted to a substrate.

Turning now to FIG. 2, a schematic front view of one example of a test vehicle 200. The test vehicle 200 includes one or more test dies 202 and one or more passive dies 204 mounted on a substrate 106. Generally, the number, size and layout of the test and passive dies 204 disposed on the substrate 106 are selected to be identical to that of the production chip package for which the test vehicle 200 is to be utilized for reliability testing. The substrate 106 may be configured as a single substrate, such as a package substrate, or comprise a plurality of stacked substrates. In the example depicted in FIG. 2, the substrate 106 is configured as an interposer substrate 108, with dies 202, 204 mounted thereon, mounted on a package substrate 110. Alternatively, the substrate 106 may be configured without an interposer substrate 108, with dies 202, 204 mounted directly on the package substrate 110.

Solder interconnects 112 are utilized to mount a bottom surface 118 of the test and passive dies 202, 204 to a top surface 120 of the interposer substrate 108. Solder connections 114 are utilized to mount a bottom surface 122 of the interposer substrate 108 to a top surface 124 of the package substrate 110. Solder balls 116 are utilized to mount a bottom surface 126 of the package substrate 110 to a printed circuit board (PCB) or test device not shown.

The solder interconnects 112 electrically and mechanically couple test circuitry 206 of the test dies 202 to substrate circuitry 132 of the substrate 106. The solder interconnects 112 also electrically and mechanically couple passive circuitry 208 of the passive dies 204 to substrate circuitry 132 of the substrate 106. The test circuitry 206 includes functional circuitry utilized to test the solder interconnects 112 coupling the test dies 202 and the passive dies 204 to substrate circuitry 132 of the substrate 106. Some of the functional test operatively performed by the test circuitry 206 include continuity testing of the solder interconnects 112 which are populated between the test and passive dies 202, 204 and the substrate 106 will form a dense array pattern that mimic the actual solder interconnects of the production chip package. Continuity and bridging (i.e., open/short) tests can be performed for each one of the solder interconnects 112, thus providing a defect detection with sensitivity up to PPM levels. Defect localization can also be performed to pinpoint exact physical failure location. All these characteristics will be examined at different stages of the accelerated reliability test and provide an insight into the possible weakness of process reliability.

The passive circuitry 208 of the passive dies 204 only includes passive circuit elements, such as routing, and does not include active circuit elements. For example, the passive circuitry 208 of the passive dies 204 does not include logic or memory structures, for example transistors. The passive circuitry 208 within the passive dies 204 terminates at the solder interconnects 112 such that the electrical characteristics of the solder interconnects 112 may be tested utilizing the passive circuitry 208 of the passive die 204 that is coupled to the test circuitry 206 of the test die 202 through the substrate circuitry 132.

The test circuitry 206 of a single test die 202 is configured to test the solder interconnects 112 between the test die 202 containing the test circuitry 206 and at least one other passive die 204 disposed on the test vehicle 200. In the example depicted in FIG. 2, two passive dies 204 are coupled to and tested by the test circuitry 206 of a single test die 202. In another example, a test vehicle 200 may include at least two test dies 202 configured to test the solder interconnects 112 between the test dies 202 containing the test circuitry 206 and at least one or more other passive dies 204 disposed on the test vehicle 200. For example, in a single test vehicle 200, two test dies 202 may share testing of one or more common passive dies 204. In yet another example, in a single test vehicle 200, two test dies 202 may respectively test one or more separate passive dies 204.

Since the passive die 204 is much less expensive than the test die 202, the cost savings allows newer technology nodes (i.e., nodes newer than 28 nm) to be utilized for the circuitries 206, 208 of both the test and passive dies 202, 204. Beneficially, the utilization of smaller technology nodes in both the test and passive dies 202, 204 enables performance testing of the circuitries 206, 208 that is more representative of the performance of the production dies that are actually built at the smaller nodes. Thus, the test vehicle 100 provides much more representative and reliable test data as compared to conventional test vehicles fabricated at older technology nodes.

Similar to the test vehicle 100 described above, the substrate circuitry 132 of the substrate 106, as shown in FIG. 2, includes interposer circuitry 128 and package circuitry 130. The solder connections 114 electrically and mechanically couple test and passive circuitry 206, 208 of the test and passive dies 202, 204 to interposer circuitry 128 of the interposer substrate 108, while the solder balls 116 electrically and mechanically couple the interposer circuitry 128 of the interposer substrate 108 to the package circuitry 130 of the package substrate 110.

Figure 3:
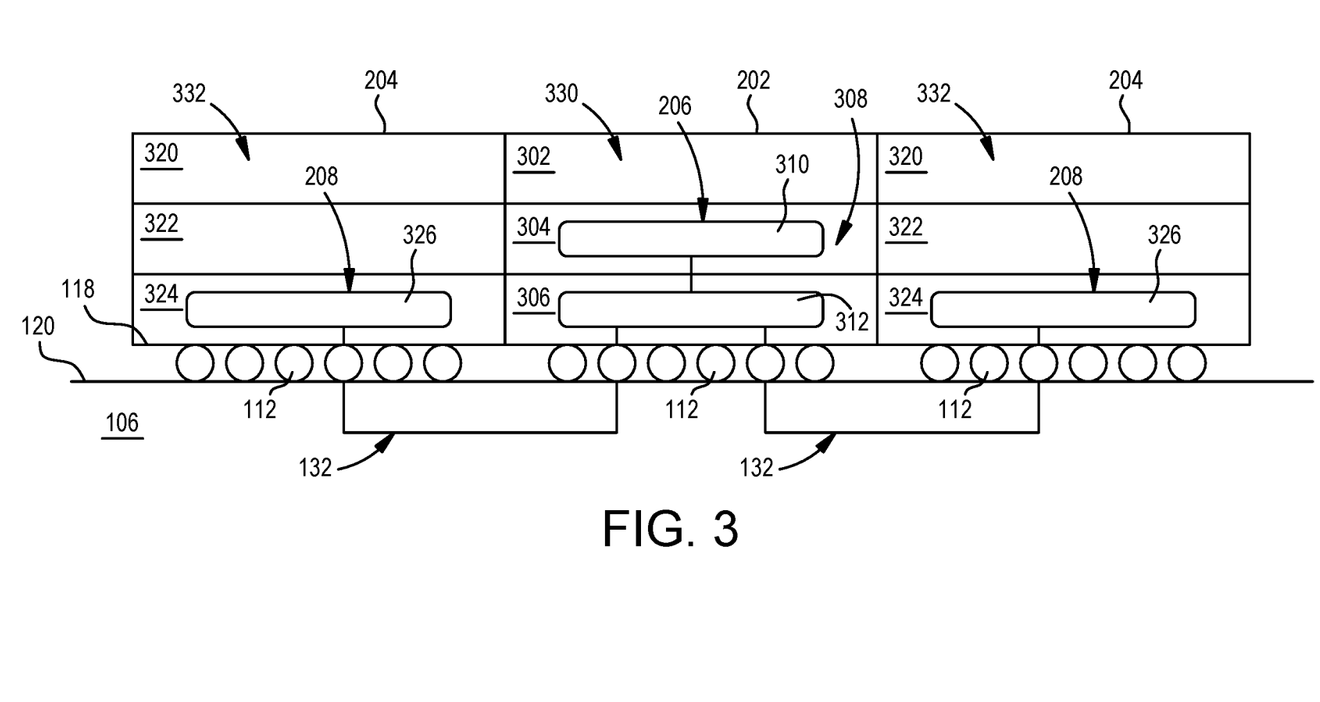
FIG. 3 is a partial enlarged front view of the test vehicle of FIG. 2 illustrating the connections between circuitry of the test and passive dies.

FIG. 3 is a partial enlarged front view of the test vehicle 200 of FIG. 2 illustrating the solder interconnects 112 disposed between the circuitry 206, 208 of the test and passive dies 202, 204. The test circuitry 206 resides within a die body 330 of the test die 202 and generally includes functional test circuitry 310 and interconnect circuitry 312. The die body 330 generally has three portions, a substrate portion 302, a front end of the line (FEOL) portion 304, and a back end of the line (BEOL) portion 306. The substrate portion 302 is comprised of a silicon or other suitable substrate. The FEOL and BEOL portions 304, 306 formed the "active" side of the test die 202. The FEOL portion 304 is disposed between the substrate portion 302 and the BEOL portion 306, and typically contains the functional test circuitry 312. The BEOL portion 306 contains the interconnect circuitry 312. Generally, the FEOL portion 304 is much more expensive to fabricate as compared to the BEOL portion 306 due to the types and size of the materials utilized, and types of structures present in each potions 304, 306.

The functional test circuitry 312 includes active circuit elements, such as transistors and the like, which enable the functionality of the test performed on the test vehicle 200. One example of the test functionality of the functional test circuitry 312 includes selectively coupling selective ones of the solder interconnects 112 of the test die 202 containing the functional test circuitry 312 to the substrate circuitry 132 to enable continuity testing and/or resistive testing of the individual solder interconnects 112 of the test die 202. Another example of the test functionality of the functional test circuitry 312 includes selectively coupling selective ones of the solder interconnects 112 of at least one of the passive dies 204 to the substrate circuitry 132 to enable continuity testing and/or resistive testing of the individual solder interconnects 112 of the coupled passive die 204. Other tests may include continuity and bridging (i.e., open/short) tests for each solder interconnect 112, reliability testing of the interconnects 112, and identification of each exact physical failure location.

The interconnect circuitry 312 is formed in the BEOL portion 306 of the die body 330. The interconnect circuitry 312 is generally fabricated from a plurality of metal segments and vias, that are separated by insulators, to form electric routings between the interconnect circuitry 312 and the solder interconnects 112 residing on the bottom surface 118 of the die body 330. The interconnect circuitry 312 contains no functional circuit elements, such as transistors and the like.

The passive circuitry 208 resides within a die body 332 of the passive die 204 and generally includes interconnect circuitry 326. Similar to the die body 330 of the test die 202, the die body 332 of the passive die 204 generally has three portions, a substrate portion 320, an optional front end of the line (FEOL) portion 322, and a back end of the line (BEOL) portion 324. The substrate portion 320 is comprised of a silicon or other suitable substrate. The FEOL and BEOL portions 322, 324 form the "active" side of the test die 202. The optional FEOL portion 322 is disposed between the substrate portion 320 and the BEOL portion 324. In one example, the FEOL portion 322 does not contain any portion the interconnect circuitry 326. The BEOL portion 324 contains the interconnect circuitry 326.

The interconnect circuitry 326 formed in the BEOL portion 324 of the die body 332 is generally fabricated from a plurality of metal segments and vias, that are separated by insulators, to form electric routings between the solder interconnects 112 residing on the bottom surface 118 of the die body 332. The passive circuitry 208, e.g., the interconnect circuitry 326, contains no functional circuit elements, such as transistors and the like. Since the passive circuitry 208 contains no functional circuit elements, the interconnect circuitry 326 may be predominantly or even complete fabricated utilizing the less expensive layers of the BEOL portion 324 of the die body 332. Additionally, the lack of functional circuit elements in the passive circuitry 208 also significantly reduces the cost and development time of the passive die 204. Moreover, the interconnect circuitry 326 may be fabricated in as few as 3 or 4 layers of the BEOL portion 324, thus requiring a much reduced mask set as compared to dies of a conventional test vehicle.

Furthermore, the low cost and simplicity of the passive die 204 enables the passive circuitry 208 to be fabricated at technology nodes smaller than 28 nm without significantly impacting the cost and length of the design cycle. For example, the design cycle of the test vehicle 200 may be half the time of that of a conventional test vehicle. Furthermore, since the passive die 204 can be made so efficient and cost effectively at technology nodes smaller than 28 nm, the test dies 202 may also be made at technology nodes smaller than 28 nm, while still enabling the test vehicle 200 to be fabricated more rapidly and at a lower cost compared to conventional test vehicles, such as the test vehicle 100 described above. Beneficially, as the circuitry 206, 208 of the dies 202, 204 can be made at technology nodes smaller than 28 nm, such as 16 nm, 14 nm, 10 nm and even 7 nm, the circuitry 206, 208 may be utilized for other test beyond simple continuity of the interconnects 112. For example, circuitry 206, 208 fabricated at smaller technology nodes may be utilized to test cross-talk, capacitive coupling and other performance metrics of the lines and other conductors within the circuitry 206, 208 of the dies 202, 204, and of the test vehicle 200 as a whole.

As discussed above, the test vehicle 200 is configured to physically duplicate the geometric size and pattern of solder connections between the dies and substrate of a production chip package. With conventional test vehicles, such as the test vehicle 100 described above, a new test vehicle must be designed for each time a different production chip package is developed having a different size. In contrast, utilizing the test vehicle 200 described herein, the test die 202 may be reused while a different size or number of passive dies 204 be developed or utilized to accommodate the size change without having the expense or delay associated with the design, new mask set, and tape out of a new test die 202 having a different geometric size. Some non-limiting examples of the flexibility of the use of test and passive dies 202, 204 within the package comprising the test vehicle 200 are illustrated with reference to FIGS. 4-7, as further described below.

Figure 4:
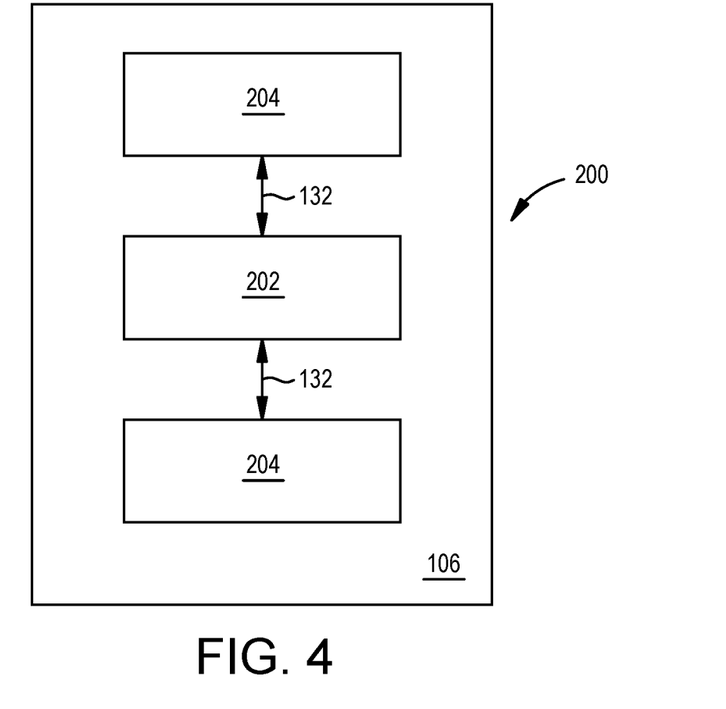
FIG. 4 is a top schematic view of the test vehicle of FIG. 2.

FIG. 4 is a top schematic view of the test vehicle 200 of FIG. 2. The test vehicle 200 of FIG. 4 illustrates two passive dies 204 and a test die 202 disposed on a substrate 106. As noted above, the substrate 106 may be solely a package substrate 110, or a combination of the package substrate 110 and an interposer substrate 108. Also as noted above, the number of dies 202, 204 utilized within the test vehicle 200 may vary.

The test die 202 is coupled by the substrate circuitry 132 to each of the passive dies 204. The test circuitry 206 of the test die 202 is utilized to test the performance of the solder interconnects 112 between the test die 202 and the substrate 106, and also the performance of the solder interconnects 112 between the passive dies 204 and the substrate 106.

In one example, the number of test dies 202 mounted to the substrate 106 is less than the number of passive dies 204 mounted to the substrate 106. In the specific example of FIG. 4, the test vehicle 200 includes one test die 202 facilitating the test of two passive dies 204. In this manner, a unique test die 202 is utilized to test the solder interconnects of at least two or more corresponding passive die 204.

Figure 5:
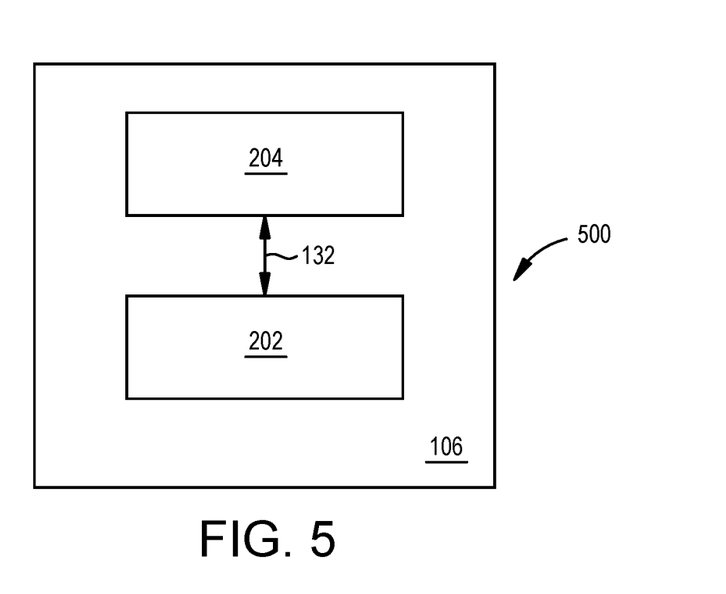
FIGS. 5-7 are top schematic views of alternative examples of a test vehicle having different arrangements of test and passive dies.

FIG. 5 is a top schematic view of another test vehicle 500. The test vehicle 500 includes at least one test die 202 and at least one passive die 204 disposed on a substrate 106. The test vehicle 500 has a one to one relationship between the number of test dies 202 and the number of passive dies 204. In this manner, a unique test die 202 is utilized to facilitate test the solder interconnects of a unique corresponding passive die 204. In the example, of FIG. 5, the test vehicle 500 has one passive die 204 and one test die 202 disposed on the substrate 106. As noted above, the substrate 106 may be solely a package substrate 110, or a combination of the package substrate 110 and an interposer substrate 108.

The test die 202 is coupled by the substrate circuitry 132 to the passive die 204. The test circuitry 206 of the test die 202 is utilized to test the performance of the solder interconnects 112 between the test die 202 and the substrate 106, and also the performance of the solder interconnects 112 between the passive die 204 and the substrate 106. The manner in which the dies 202, 204 are coupled to the substrate 106 are as described above with reference to FIGS. 1-3.

Figure 6:
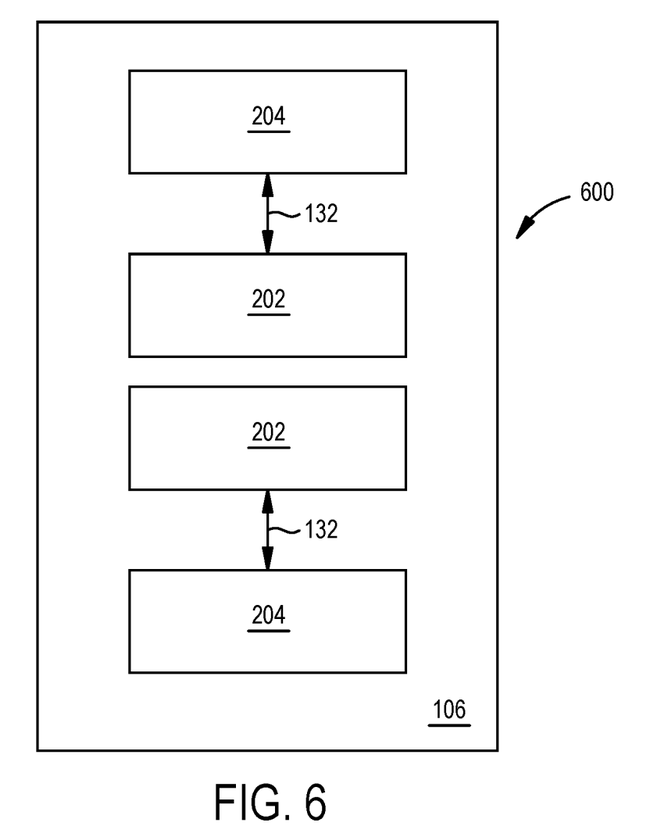

FIG. 6 is a top schematic view of another test vehicle 600. The test vehicle 600 includes a plurality of test dies 202 and a plurality of passive dies 204 disposed on a substrate 106. In the example, of FIG. 6, the test vehicle 600 has two passive dies 204 and two test dies 202 disposed on the substrate 106. As noted above, the substrate 106 may be solely a package substrate 110, or a combination of the package substrate 110 and an interposer substrate 108.

The test die 202 is coupled by the substrate circuitry 132 to the passive die 204. The test circuitry 206 of the test die 202 is utilized to test the performance of the solder interconnects 112 between the test die 202 and the substrate 106, and also the performance of the solder interconnects 112 between the passive die 204 and the substrate 106. The manner in which the dies 202, 204 are coupled to the substrate 106 are as described above with reference to FIGS. 1-3.

In the example depicted in FIG. 6, the test vehicle 600 has a one to one relationship between the number of test dies 202 and the number of passive dies 204. Alternatively, the number of test dies 202 may exceed the number of passive dies 204, or the number of passive dies 204 may exceed the number of test dies 202. In the example of FIG. 6, a unique test die 202 is utilized to test the solder interconnects of a unique corresponding passive die 204. However, in another example, a unique test die 202 may be utilized to test the solder interconnects of more than one corresponding passive die 204. In another example, more than one test die 202 may be utilized to test the solder interconnects of a single passive die 204.

Figure 7:
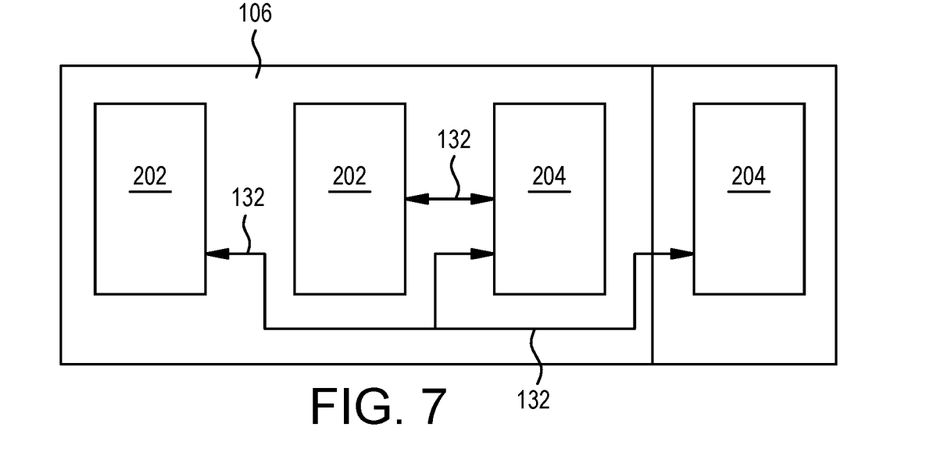

FIG. 7 is a top schematic view of another test vehicle 700. The test vehicle 700 includes a plurality of test dies 202 and at least one passive die 204 disposed on a substrate 106. In the example of FIG. 7, the test vehicle 700 has two test dies 202 and a single passive die 204 disposed on the substrate 106. As noted above, the substrate 106 may be solely a package substrate 110, or a combination of the package substrate 110 and an interposer substrate 108.

The test dies 202 are coupled by the substrate circuitry 132 to the passive die 204. The test circuitry 206 of the test dies 202 is utilized to test the performance of the solder interconnects 112 between the test dies 202 and the substrate 106, and also the performance of the solder interconnects 112 between the passive die 204 and the substrate 106. The manner in which the dies 202, 204 are coupled to the substrate 106 are as described above with reference to FIGS. 1-3.

In the example depicted in FIG. 7, the test vehicle 700 has at least a two to one relationship between the number of test dies 202 and the number of passive dies 204. Although the ratio between the number of test dies 202 and the number of passive dies 204 is 2:1 in the example of FIG. 7, the ratio between the number of test dies 202 and the number of passive dies 204 may alternatively be N to M, wherein N is the number test dies 202 and M is the number of passive dies 204, and wherein N is greater than M. In the example of FIG. 7, at least two unique test dies 202 are utilized to test the solder interconnects of a unique corresponding passive die 204. However in another example, N unique test dies 202 are utilized to test the solder interconnects of M passive die 204. In yet another, a first test die 202 may be utilized to test the solder interconnects of first and second passive dies 204, while a second test die 202 may be utilized to test the solder interconnects of the first passive die 204 and a third passive die 204. The third passive die 204 is not connected to the first test die 202.

Additionally illustrated in FIG. 7 is the ease at which a new test vehicle may be configured utilizing the same test die 202 by adding one or more additional passive dies 204, or one or more passive dies 204 having a different size. Advantageously, the design of the test die 202 containing the more expensive test circuitry can be utilized in another test vehicle while the less expensive passive dies 204 may be redesigned to accommodate the change in geometry of the production chip package. For example as illustrated by the dashed lines, one test vehicle may have a different size as compared to another test vehicle. Thus, another passive die 204, also shown in phantom by the dashed lines, may be inexpensively utilized to accommodate the different size test vehicle. Moreover, since the design time to fabricate a new passive die 204 is very short as compared to fabricate a test design 202, a new test vehicle may be designed very early in the design stage of the production chip package, thus enabling reliability and other testing to be performed utilizing the test vehicle in parallel with the design of the production chip package, advantageously making test results and information available with time to enhance the final design of the production chip package.

Figure 8:
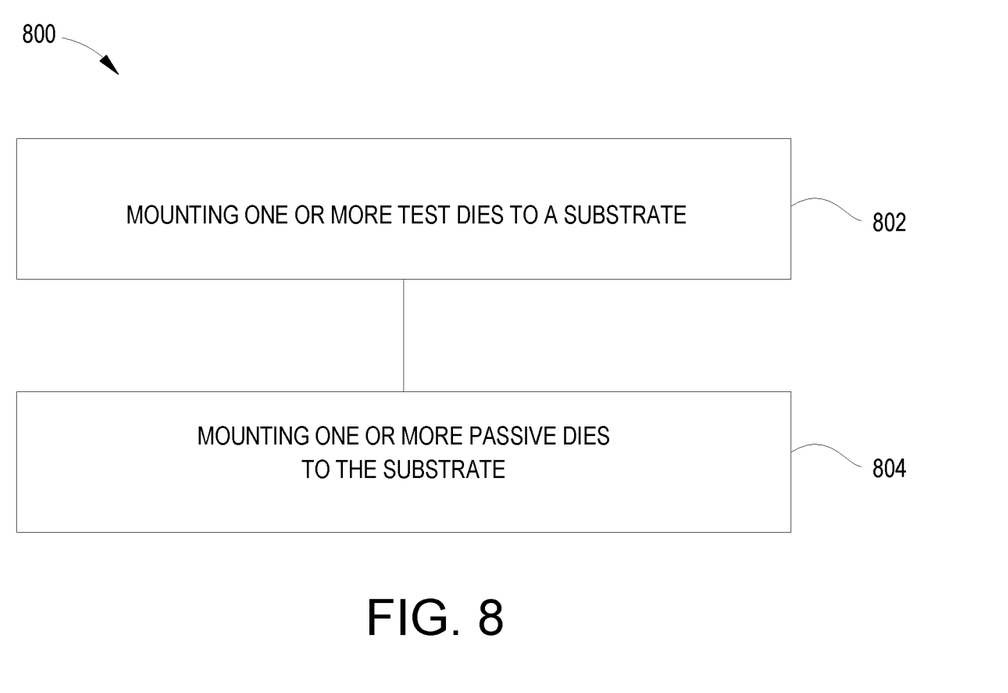
FIG. 8 is a flow diagram of a method for fabricating a test vehicle.

FIG. 8 is a flow diagram of a method 800 for fabricating a test vehicle. The test vehicle may be any of the test vehicles describe above, or other suitable test vehicle. The method 800 begins at operation 802 by mounting one or more test dies to a substrate. The test die includes active, i.e., functional, circuitry configured to test at least the solder interconnects between the test die and at least one other die mounted to the substrate. The test die is mounted to the substrate using solder interconnects. The solder interconnects are coupled to the active circuitry.

At operation 804, one or more passive dies are mounted to the substrate. The passive die includes passive circuitry, for example circuitry without transistors. The passive die is mounted to the substrate using solder interconnects. The solder interconnects are coupled to the passive circuitry. The passive circuitry is coupled to the test circuitry of the test die through interconnect circuitry of the substrate.

Figure 9:
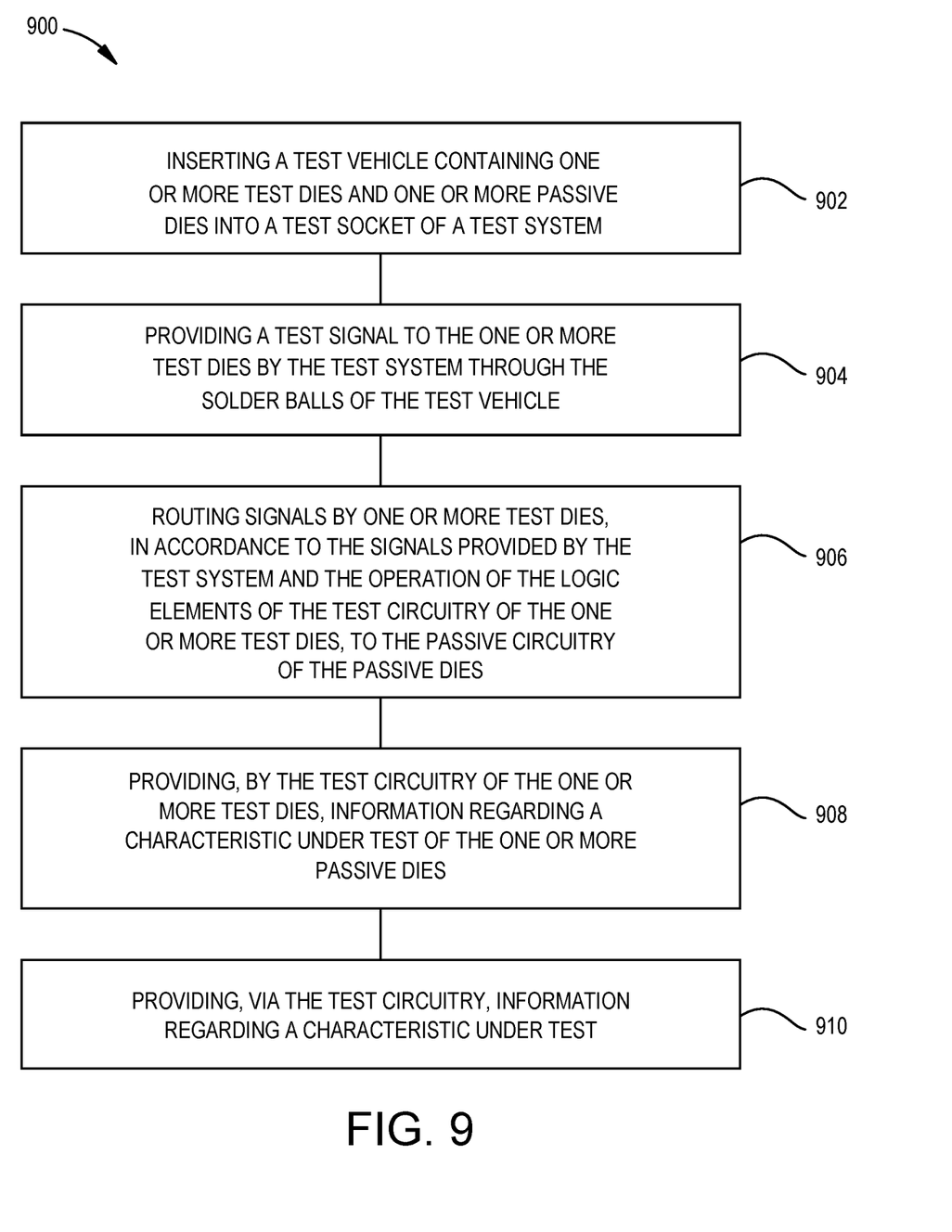
FIG. 9 is a flow diagram of a method for reliability testing of a chip package using a test vehicle.

FIG. 9 is a flow diagram of a method 900 for testing of a chip package using a test vehicle. The test vehicle may be any of the test vehicles describe above, or other suitable test vehicle.

The method 900 begins at operation 902 by inserting a test vehicle containing one or more test dies and one or more passive dies into a test socket of a test system. The test vehicle includes a substrate having a first side upon which the test and passive dies are mounted. The substrate additionally includes a plurality of solder balls exposed on a second side of the substrate that is opposite the first side to which the test and passive dies are mounted. The test die includes active, i.e., functional, circuitry configured to test at least the solder interconnects between the test die and at least one other die mounted to the substrate. The passive die includes passive circuitry, for example circuitry without transistors.

At operation 904, a test signal is provided to the one or more test dies by the test system through the solder balls of the test vehicle. At operation 906, the one or more test dies route signals, in accordance to the signals provided by the test system and the operation of the logic elements of the test circuitry of the one or more test dies, to the passive circuitry of the passive dies.

At operation 908, the test circuitry of the one or more test dies provides information regarding a characteristic under test of the one or more passive dies. The characteristic under test may be continuity of the solder interconnects between the passive dies and the substrate, the possibility of bridging between adjacent interconnects, reliability testing of the interconnects, and the identification of each exact physical failure location.

At operation 910, the test circuitry of the one or more test dies provides information regarding a characteristic under test of the one or more test dies. The characteristic under test may be continuity of the solder interconnects between the test dies and the substrate, the possibility of bridging between adjacent interconnects, the identification of each exact physical failure location, reliability testing of the interconnects, and performance of signal transmission through the circuitry of the test vehicle.

Figure 10:
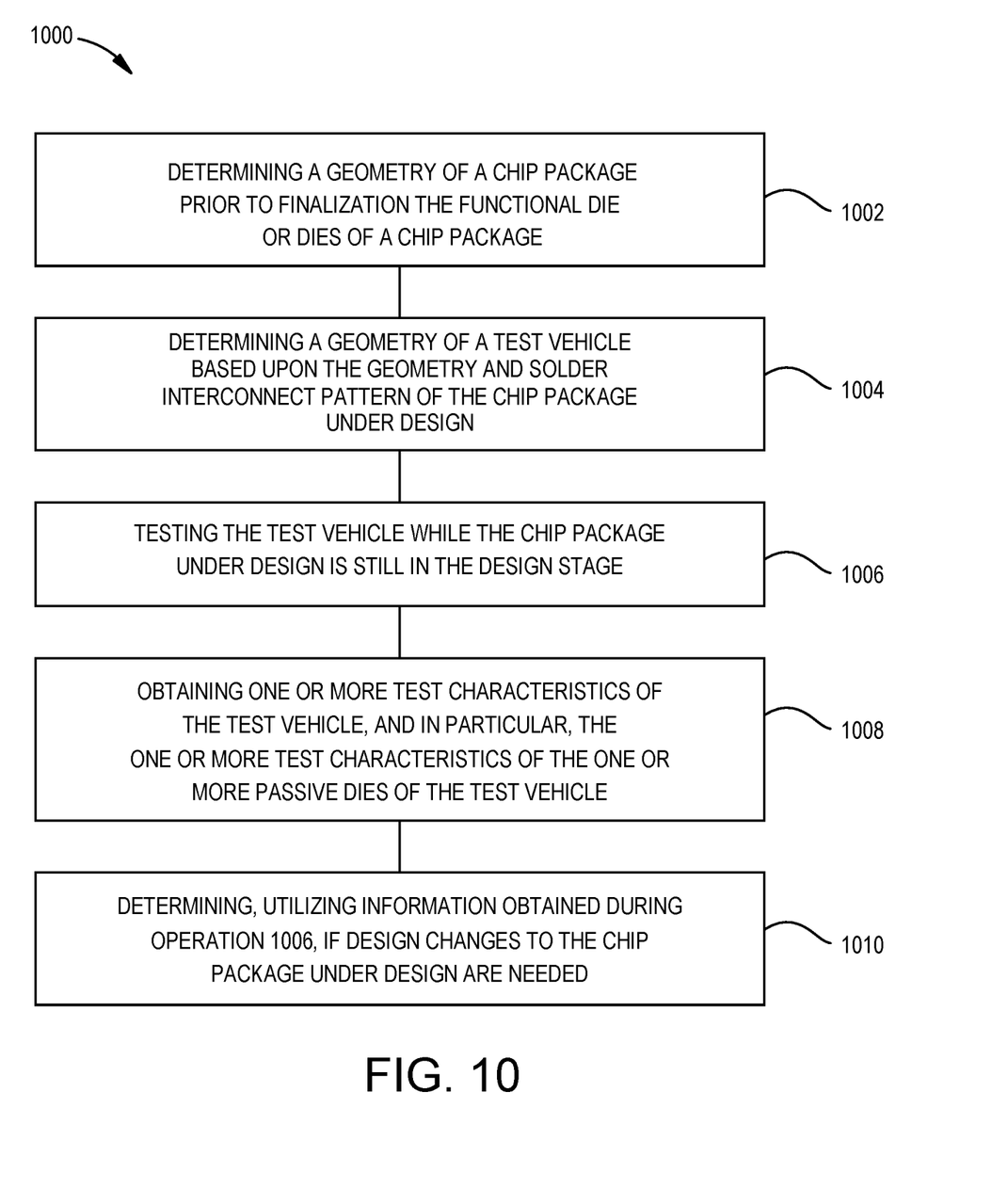
FIG. 10 is a flow diagram of a method for designing a chip package using a test vehicle.

FIG. 10 is a flow diagram of a method 1000 for designing a chip package using a test vehicle. The method 1000 begins at operation 1002 by determining a geometry of a chip package prior to finalization the functional die or dies of the chip package. At operation 1004, a geometry of a test vehicle is determined based upon the geometry and solder interconnect pattern of the chip package under design. The test vehicle includes one or more test dies and one or more passive dies, as described above.

At operation 1006, the test vehicle placed under test while the chip package under design is still in the design stage, for example, before tape out. The test at operation 1006 obtains one or more test characteristics of the test vehicle, and in particular, the one or more test characteristics of the one or more passive dies of the test vehicle. The test at operation 1006 also obtains one or more test characteristics of the one or more test dies of the test vehicle. The characteristic may be continuity of the solder interconnects between the passive dies and the substrate, the possibility of bridging between adjacent interconnects, the identification of each exact physical failure location, reliability testing of the interconnects, and the performance of signal transmission within the test vehicle.

At operation 1008, information obtained during operation 1006 about the test vehicle is utilized to determine if design changes to the chip package under design is needed. For example at operation 1008, information obtained during operation 1006 about the test vehicle may be utilized to change the geometry of one of the functional dies of the chip package, change the arrangement of solder interconnects between the functional dies of the chip package and a substrate of the chip package, change a parameter of the chip package to correct warpage indicated by the information obtained during operation 1006, or another parameter or characteristic of the chip package.

Thus, test vehicles, along with methods for fabricating and using a test vehicle, have been described above that significantly reduce the cost and design cycle of both the test vehicle and the chip package for which the test vehicle is utilized for reliability testing of the chip package. Fast and cost effective fabrication of the test vehicle advantageously enables the parallel testing and shortening of the chip package development cycle, allowing production chip packages to be commercially released much faster than conventional processes. As described above, the test vehicle described below leverages passive dies for testing large numbers of the solder connections within the test vehicle, the cost and design and fabrication time of the test vehicle is significantly reduced as compared to conventional test vehicles. Additionally, the low cost and fast design cycle of the test vehicles described herein enables smaller technology nodes (e.g., less than 28 nm) to be utilized, enabling performance testing which cannot be effectively performed utilizing the larger technology nodes found in conventional test vehicles.

While the foregoing is directed to embodiments of the present disclosure, other and further embodiments may be devised without departing from the basic scope thereof, and the scope thereof is determined by the claims that follow.

What is claimed is:

1. A test vehicle comprising:
  a substrate having substrate circuitry;
  at least a first passive die mounted on the substrate, wherein the first passive die includes passive circuitry that does not include logic or memory structures; and
  at least a first test die mounted on the substrate, wherein the first test die comprises test circuitry configured to test continuity through solder interconnects formed between the substrate and the first passive die, wherein the solder interconnects electrically and mechanically couple the passive circuitry of the first passive die to the substrate circuitry, and the passive circuitry of first passive die is communicatively coupled to the test circuitry.

2. The test vehicle of claim 1, wherein the first passive die includes no functional circuitry.

3. The test vehicle of claim 1, wherein the passive circuitry is formed in BEOL layers of the first passive die.

4. The test vehicle of claim 1, wherein the first test die comprises:
  a FEOL portion containing the test circuitry; and
  a BEOL portion containing interconnect circuitry, the interconnect circuitry coupling the test circuitry to the solder interconnects disposed between the substrate and the first test die.

5. The test vehicle of claim 1, wherein the test circuitry of the first test die is further configured to test continuity through solder interconnects formed between the substrate and the first test die.

6. The test vehicle of claim 1 further comprising:
  a second passive die mounted on the substrate, the second passive die having only passive circuitry.

7. The test vehicle of claim 6, wherein the passive circuitry of the second passive die is coupled to the test circuitry of the first test die.

8. The test vehicle of claim 6 further comprising:
  a second test die, wherein the passive circuitry of the second passive die is coupled to test circuitry of the second test die.

9. The test vehicle of claim 1 further comprising:
  a second test die mounted on the substrate, the second test die having only test circuitry coupled to the passive circuitry of the first passive die.

10. The test vehicle of claim 1, wherein the substrate further comprises:
  a package substrate with or without an interposer substrate.

11. A test vehicle comprising:
  a substrate including substrate circuitry;
  one or more passive dies including at least a first passive die, the first passive die mounted on the substrate by solder interconnects, the first passive die containing passive circuitry and not containing functional circuitry; and
  one or more test dies including at least a first test die mounted on the substrate by solder interconnects, wherein the first test die comprises test circuitry configured to test a characteristic of the first passive die and a characteristic of the first test die, wherein the solder interconnects electrically and mechanically couple passive circuitry of the first passive die to the substrate circuitry, and the passive circuitry is communicatively coupled to the test circuitry.

12. The test vehicle of claim 11 further comprising:
  a second passive die of the one or more passive dies mounted on the substrate by solder interconnects, the second passive die containing passive circuitry and not containing functional circuitry, the passive circuitry of the second passive die coupled to the test circuitry of the first test die.

13. The test vehicle of claim 11 further comprising:
  a second passive die of the one or more passive dies, the second passive die containing passive circuitry and not containing functional circuitry; and
  a second test die of the one or more test dies containing test circuitry, the test circuitry of the second test die coupled to the passive circuitry of the second passive die.

14. A method for testing a test vehicle, the method comprising:
  inserting a test vehicle containing one or more test dies and one or more passive dies into a test socket of a test system enabling communication between the test vehicle and the test system through solder balls disposed on a bottom surface of the test vehicle;
  providing one or more test signals to the one or more test dies from the test system through the solder balls;
  transmitting the one or more test signals from the one or more test dies through interconnect circuitry of a substrate to the one or more passive dies; and
  obtaining information regarding a characteristic under test of the one or more passive dies in response to the test signal provided to test circuitry of the one or more test dies, the one or more passive dies containing passive circuitry and not containing functional circuitry.

15. The method of claim 14 further comprising:
  routing the one or more signals from the one or more test dies to the passive circuitry of the one or more passive dies.

16. The method of claim 14, wherein obtaining information regarding the characteristic under test further comprises:
  determining at least one of continuity of solder connections between the one or more passive dies and the substrate, and signal transmission within the test vehicle.

17. The method of claim 14 further comprising:
  changing a design parameter of a chip package under design in response to the information.

18. The method of claim 14, wherein transmitting the one or more test signals from the one or more test dies through interconnect circuitry of the substrate to the one or more passive dies further comprises:

transmitting the one or more test signals from a first test die of the one or more test dies to at least two passive dies of the one or more passive dies.

19. The method of claim 14, wherein transmitting the one or more test signals from the one or more test dies through interconnect circuitry of the substrate to the one or more passive dies further comprises:

transmitting the one or more test signals from a first test die of the one or more test dies to a first passive die of the one or more passive dies; and transmitting the one or more test signals from a second test die of the one or more test dies to a second passive die of the one or more passive dies.

* * * * *